(12) United States Patent
Chung

(10) Patent No.: US 8,174,115 B2
(45) Date of Patent: May 8, 2012

(54) MULTI-CHIP PACKAGE MEMORY DEVICE

(75) Inventor: Hoe-Ju Chung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 355 days.

(21) Appl. No.: 12/619,083

(22) Filed: Nov. 16, 2009

(65) Prior Publication Data

US 2010/0164094 A1 Jul. 1, 2010

(30) Foreign Application Priority Data

Dec. 26, 2008 (KR) .................. 10-2008-0134980

(51) Int. Cl.
*H01L 25/16* (2006.01)
(52) U.S. Cl. ............. 257/723; 257/E25.029; 257/686
(58) Field of Classification Search .............. 257/723, 257/E25.029, 686
See application file for complete search history.

(56) References Cited

U.S. PATENT DOCUMENTS

| | | | |
|---|---|---|---|
| 7,209,376 B2 | 4/2007 | Saito et al. | |
| 7,230,876 B2 * | 6/2007 | Walker | 365/230.01 |
| 7,379,316 B2 | 5/2008 | Rajan | |
| 2007/0194455 A1 | 8/2007 | Ikeda et al. | |
| 2007/0228456 A1 * | 10/2007 | Ikeda et al. | 257/324 |

FOREIGN PATENT DOCUMENTS

KR 1020040091580 A 10/2004

* cited by examiner

*Primary Examiner* — Evan Pert
*Assistant Examiner* — Krista Soderholm
(74) *Attorney, Agent, or Firm* — Myers Bigel Sibley & Sajovec, P.A.

(57) ABSTRACT

Provided is a multi-chip package memory device. The multi-chip package memory device may include a transmission memory chip and a plurality of memory chips that are stacked on the transmission memory chip. The transmission memory chip may include a temporary storage unit, and may transmit a received command or received data to a corresponding memory chip, or to an external element. Each of the memory chips may include a memory core, and may delay the received command according to the properties of the memory chips and then may output delay commands. The transmission memory chip may store the received data in different portions of the temporary storage unit when the delay commands are respectively received.

10 Claims, 9 Drawing Sheets

MULTI-CHIP PACKAGE MEMORY DEVICE

REFERENCE TO PRIORITY APPLICATION

This application claims the benefit of Korean Patent Application No. 10-2008-0134980, filed Dec. 26, 2008, the contents of which are hereby incorporated herein by reference.

FIELD OF THE INVENTION

The inventive concept relates to a memory device, and more particularly, to a multi-chip package memory device including stacked memory chips.

BACKGROUND

Recently, as electronic devices have become increasingly smaller, semiconductor packages installed in electronic portable devices have also become smaller and lighter. On the other hand, the capacities of memory chips installed in the semiconductor packages have increased. Generally, single-chip package memories including a memory chip performing a single function have been used. However, recently, multi-chip package memories including a plurality of stacked memory chips performing two or more functions have been manufactured.

A plurality of memory chips included in a multi-chip package memory are stacked by stacking an interface chip and the memory chips, or stacking a memory controller and the memory chips.

In a general multi-chip package memory, for example, when first and second memory chips are stacked, each of the first and second memory chips and a pad are electrically connected by a bonding wire. That is, the first memory chip and a first pad are electrically connected by the bonding wire. The second memory chip and a second pad are electrically connected by the bonding wire.

SUMMARY

According to an aspect of the inventive concept, there is provided a multi-chip package memory device including a plurality of stacked memory chips, and a plurality of memory chips stacked on the stacked memory chips. The transmission memory chip may include a temporary storage unit, and may transmit a received command or received data to a corresponding memory chip or an external element. A plurality of memory chips may each include a memory core, each delaying the received command according to properties of the corresponding memory chip from among the memory chips, and then may output a delay command, and stacked on the transmission memory chip. The transmission memory chip may store the received data in different portions of the temporary storage unit when a plurality of the delay commands are respectively received.

The transmission memory chip may further include a control signal generating unit generating control signals having bits that are sequentially shifted when the delay commands are respectively received. The temporary storage unit may store the received data in response to the control signal.

Each of the memory chips may include a transistor including a gate to which a corresponding delay command is applied, a first terminal connected to a first node, and a second terminal connected to a ground voltage. Transmission memory chip may include a resistor connected between the first node and a power voltage. The control signal generating unit may be connected between the first node and the temporary storage unit, and generates the control signals in response to a signal applied through the first node.

The transmission memory chip may further include a calculating unit performing a logical sum on the delay commands and then sequentially outputting an output signal, and the control signal generating unit may generate the control signals in response to the output signal of the calculating unit.

The calculating unit may include a plurality of transistors each including a gate to which a corresponding delay command is applied, a first terminal connected to a first node, and a second terminal connected to a ground voltage, and a resistor between the first node and a power voltage.

Each of the memory chips may include a delay controlling unit delaying the received command by as much as a time taken to access the memory core, and then outputting the delay command.

The transmission memory chip may further include a memory core, and delays the received command and outputs a delay command.

DETAILED DESCRIPTION OF THE EMBODIMENTS

Figure 1:
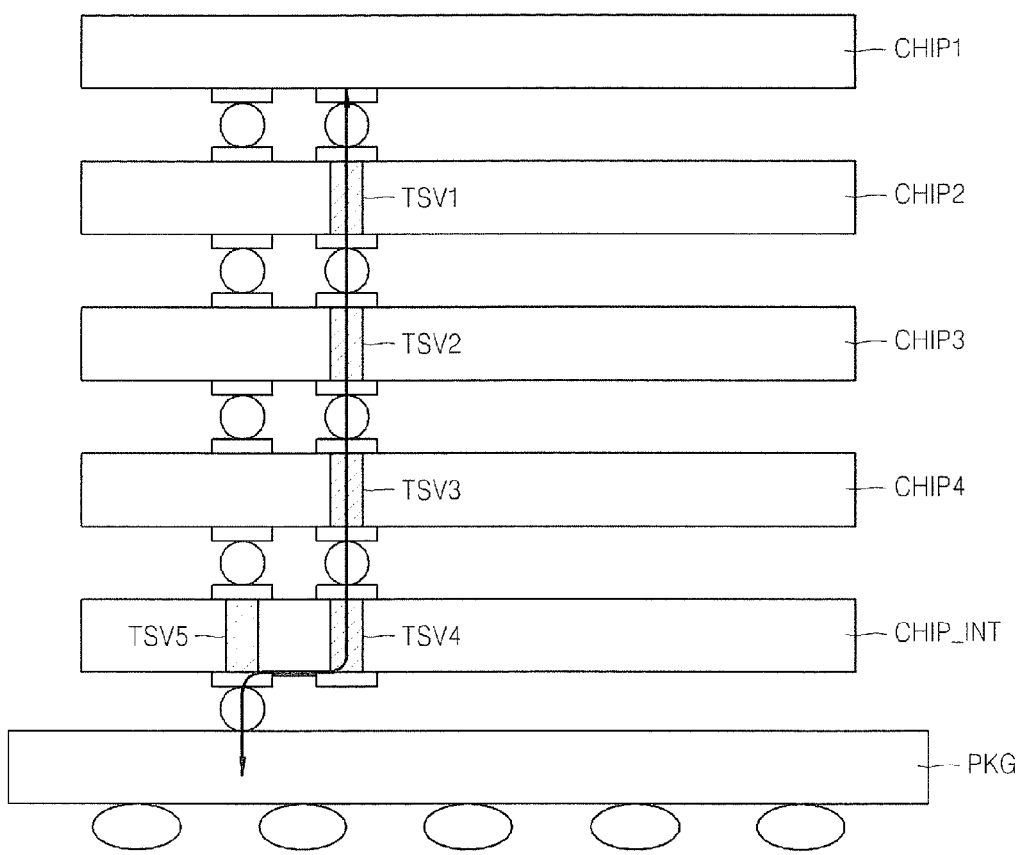
FIG. 1 is a cross-sectional view of a multi-chip package memory device including a plurality of memory chips that are vertically stacked on a transmission memory chip, according to an embodiment.

The attached drawings for illustrating exemplary embodiments of the inventive concept are referred to in order to gain a sufficient understanding of the inventive concept, the merits thereof, and the objectives accomplished by the implementation of the inventive concept.

Hereinafter, the inventive concept will be described in detail by explaining embodiments of the inventive concept with reference to the attached drawings. Like reference numerals denote like elements in the drawings.

FIG. 1 is a cross-sectional view of a multi-chip package memory device including a plurality of memory chips that are vertically stacked on a transmission memory chip CHIP_INT, according to an embodiment.

Referring to FIG. 1, four memory chips CHIP1, CHIP2, CHP3 and CHIP4 are vertically stacked on the transmission memory chip CHIP_INT. Of course, the number of stacked memory chips is not limited to four.

The transmission memory chip CHIP_INT may transmit signals (e.g., a command) that are externally input thereto to the memory chips CHIP1, CHIP2, CHP3 and CHIP4, or may externally transmit data of the memory chips CHIP1, CHIP2, CHP3 and CHIP4. The memory chips CHIP1, CHIP2, CHIP3 and CHIP4, and the transmission memory chip CHIP_INT are connected to each other via through electrodes TSV1, TSV2, TSV3, TSV4 and TSV5, or are connected to a package PKG. The memory chips CHIP1, CHIP2, CHIP3 and CHIP4 that are vertically stacked, and the transmission memory chip CHIP_INT transmit and receive data, signals, or the like via the through electrodes TSV1, TSV2, TSV3, TSV4 and TSV5.

Figure 2:
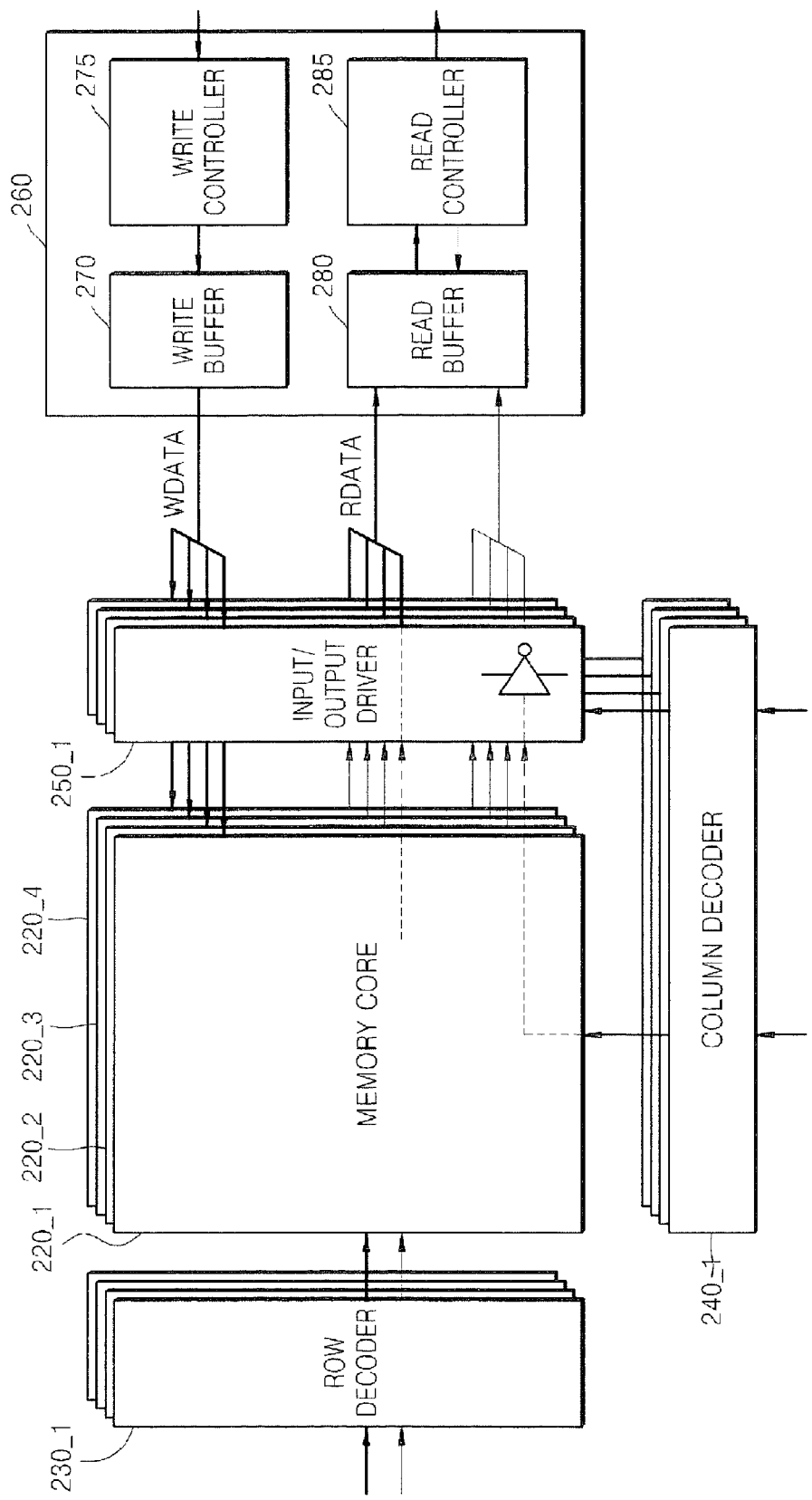
FIG. 2 is a schematic block diagram of the multi-chip package memory device of FIG. 1.

FIG. 2 is a schematic block diagram of the multi-chip package memory device of FIG. 1.

Referring to FIG. 2, the multi-chip package memory device of FIG. 1 includes the memory chips CHIP1, CHIP2, CHP3 and CHIP4 and the transmission memory chip CHIP_INT. Each memory chip (e.g., the memory chip CHIP1) includes a memory core 220_1, a row decoder 230_1, a column decoder 240_1, and an input/output driver 250_1. The transmission memory chip CHIP_INT includes a write buffer 270, a write controller 275, a read buffer 280, and a read controller 285.

Write data WDATA is written on the memory core 220_1 through the write controller 275, the write buffer 270, and the input/output driver 250_1. Read data RDATA is externally read through the memory core 220_1, the input/output driver 250_1, the read buffer 280, and the read controller 285. The row decoder 230_1, and the column decoder 240_1 determine an address that is to be read or written from among addresses of the memory core 220_1.

Figure 3A:
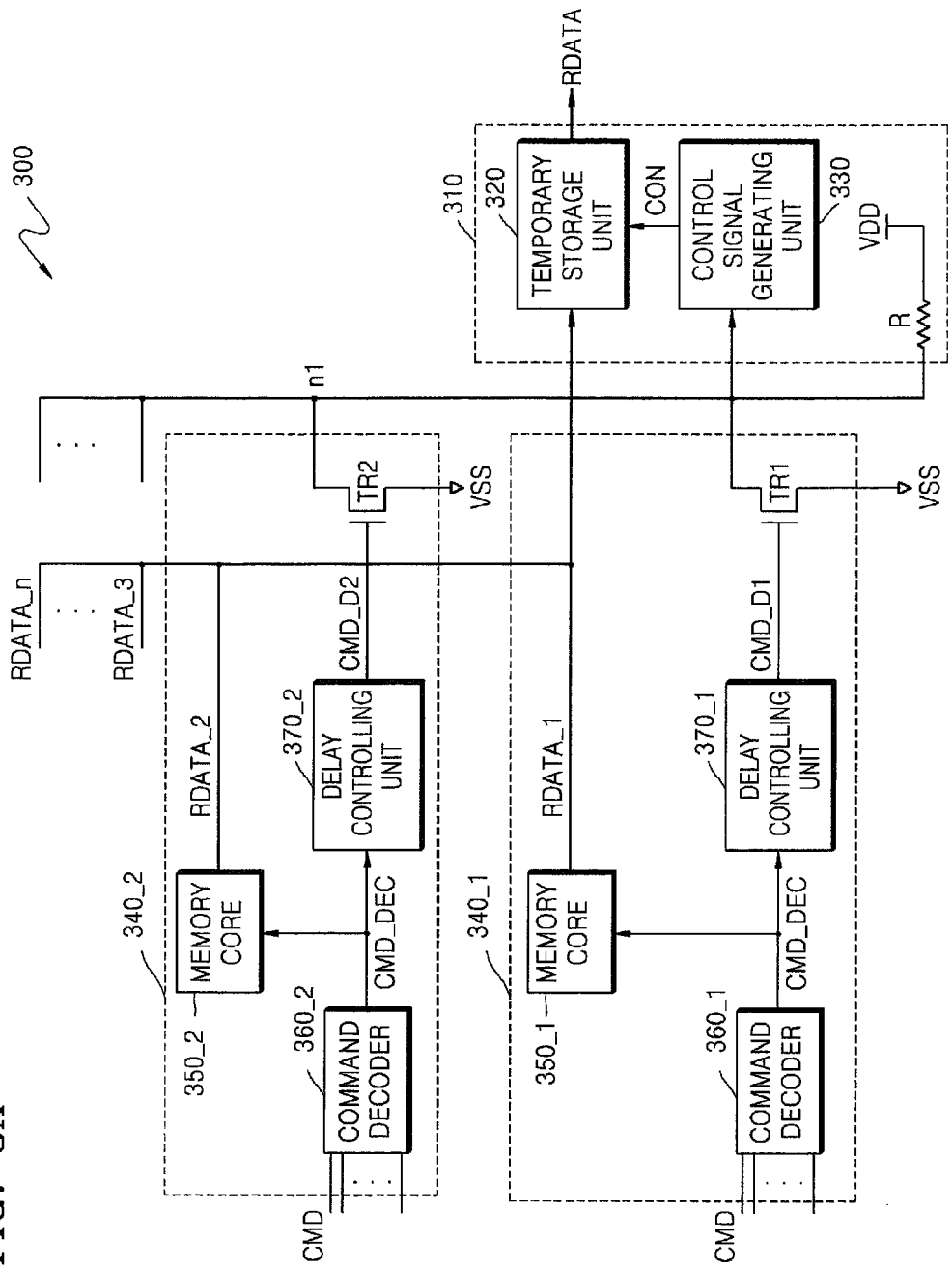
FIG. 3A is a block diagram of a multi-chip package memory device according to an embodiment.

FIG. 3A is a block diagram of a multi-chip package memory device 300 according to an embodiment.

Referring to FIG. 3, the multi-chip package memory device 300 may include a transmission memory chip 310, and first through n memory chips 340_1, 340_2, through 340_n (n is a natural number) that are stacked on the transmission memory chip 310. Although only the first memory chip 340_1 and the second memory chip 340_2 are illustrated in FIG. 3, a plurality of memory chips each having the same structure may be stacked. In FIG. 3, it is assumed that n (n is a natural number) memory chips are stacked, and first through n read data RDATA_1, RDATA_2, through RDATA_n are transmitted.

The transmission memory chip 310 may include a temporary storage unit 320, and a control signal generating unit 330. The transmission memory chip 310 may be an interface chip that transmits a received command or received data to a corresponding memory chip or to an external element. For example, when the transmission memory chip 310 receives a read command CMD, the transmission memory chip 310 may transmit the read command CMD to a corresponding memory chip from among the memory chips 340_1, 340_2, through 340_n. Alternatively, the transmission memory chip 310 may receive the first through n read data RDATA_1, RDATA_2, through RDATA_n from the memory chips 340_1, 340_2, through 340_n, and may externally transmit the first through n read data RDATA_1, RDATA_2, through RDATA_n. The temporary storage unit 320 may be a first-in first-out (FIFO) unit, and the control signal generating unit 330 may be a shift resistor.

The first and second memory chips 340_1 and 340_2 have the same structure, and thus multi-chip package memory device 300 will be described in terms of the first memory chip 340_1, for convenience of description.

The first memory chip 340_1 may include a memory core 350_1, a command decoder 360_1, and a delay controlling unit 370_1. The memory core 350_1 may include a plurality of memory cells in which data is stored. The command decoder 360_1 decodes a received read command CMD, and then outputs a decoding command CMD_DEC. Hereinafter, elements included in the multi-chip package memory device 300 are operated based on the decoding command CMD_DEC in FIG. 3. Alternatively, the elements may be operated based on the read command CMD. The delay controlling unit 370_1 may delay the decoding command CMD_DEC by as much as a time that is taken for the decoding command CMD_DEC to access the memory core 350_1, and then may output a delay command CMD_D1.

When process variations of the first through n memory chips 340_1, 340_2, through 340_n are different from each other, each of delay controlling units 370_1 and 370_2 delays and outputs the decoding command CMD_DEC according to the process variation of a corresponding memory chip. A process variation refers to a time taken to receive and perform a predetermined command. For example, a process variation may be a time taken for each memory core to receive a read command and read data. It is assumed that the process variation of the first memory chip 340_1 is 9 [ns], and the process variation of the second memory chip 340_2 is 11 [ns]. In this case, the delay controlling unit 370_1 may delay and output the received decoding command CMD_DEC by as much as 9 [ns], and the delay controlling unit 370_2 may delay and output the received decoding command CMD_DEC by as much as 11 [ns].

The first memory chip 340_1 may include a transistor TR1 including: a gate to which a corresponding delay command CMD_D1 is applied; a first terminal connected to a first node n1; and a second terminal connected to a ground voltage VSS. In addition, the transmission memory chip 310 may include a resistor R connected between the first node n1 and a power voltage VDD. Due to transistors TR1 and TR2, the transmission memory chip 310 may recognize whether a read command has been transmitted from each of the first and second memory chips 340_1 and 340_2.

When the first through n memory chips 340_1, 340_2, through 340_n include the transistors TR1, TR2, through TRn, respectively, the transmission memory chip 310 stores the first through n read data RDATA_1, RDATA_2, through RDATA_n in different portions of the temporary storage unit 320 when the delay commands CMD_D1, CMD_D2, through CMD_Dn are respectively received, in response to signals applied through the first node n1. When the transmission memory chip 310 receives the delay commands CMD_D1, CMD_D2, through CMD_Dn directly, the transmission memory chip 310 stores the first through n read data RDATA_1, RDATA_2, through RDATA_n in different portions of the temporary storage unit 320 when the delay commands CMD_D1, CMD_D2, through CMD_Dn are respectively received. The control signal generating unit 330 may generate control signals CON having bits that are sequentially shifted as the delay commands CMD_D1, CMD_D2, through CMD_Dn are respectively received. The temporary storage unit 320 and the control signal generating unit 330 will be described in more detail with reference to FIGS. 5 and 6.

Figure 3B:
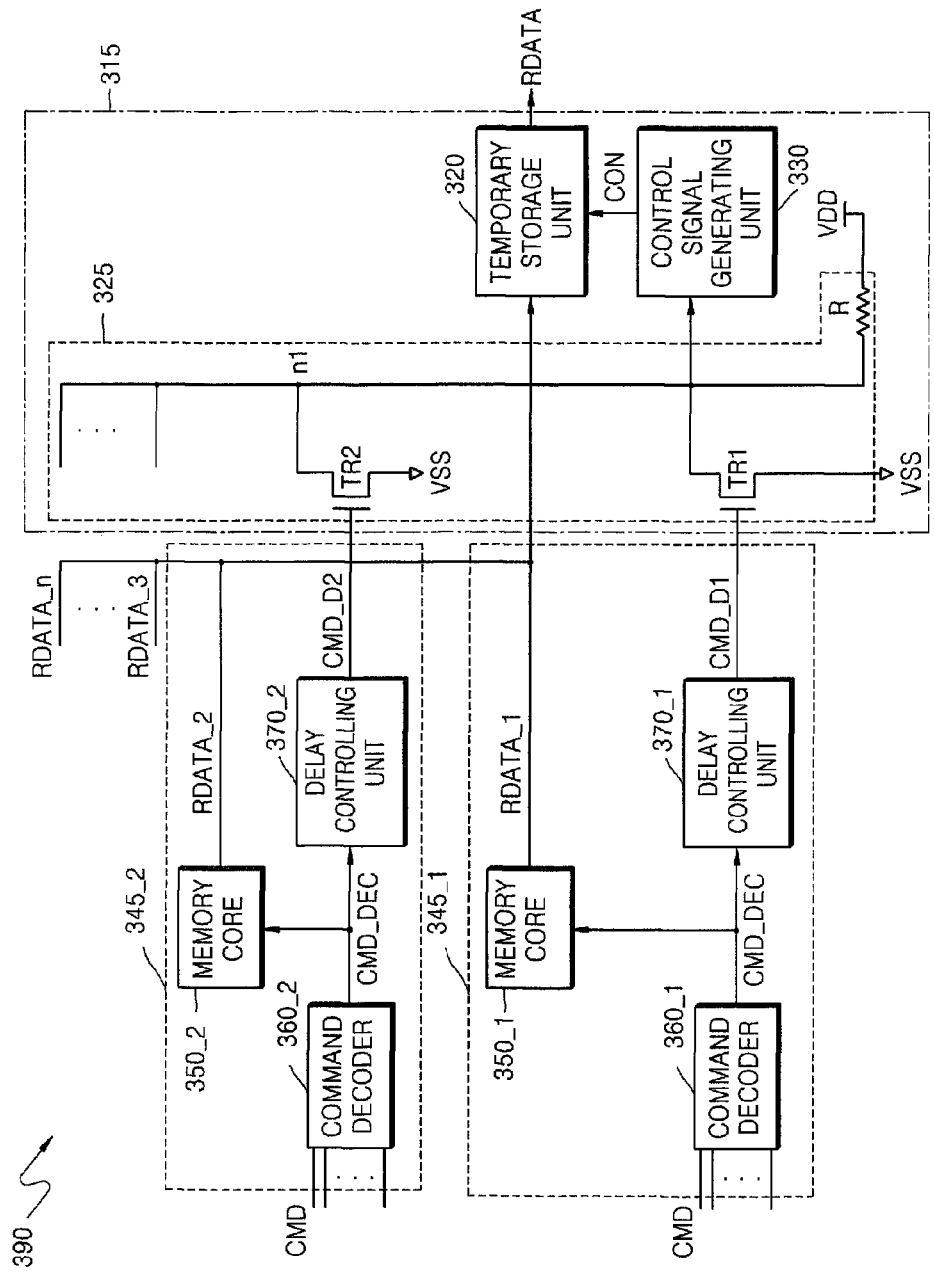
FIG. 3B is a block diagram of a multi-chip package memory device according to another embodiment.

FIG. 3B is a block diagram of a multi-chip package memory device 300 according to another embodiment.

In FIG. 3A, the first through n memory chips 340_1, 340_2, through 340_n include transistors TR1, TR2, through TRn, respectively. However, in FIG. 3B, the first through n memory chips 345_1, 345_2, through 345_n may not include the transistors TR1, TR2, through TRn, and the resistor R, respectively. In this case, delay commands CMD_D1, CMD_D2, through CMD_Dn may be transmitted directly to the transmission memory chip 315. In addition, the transmission memory chip 315 may further include a calculating unit 325 that performs a logical sum on the delay commands CMD_D1, CMD_D2, through CMD_Dn and sequentially outputs the delay commands CMD_D1, CMD_D2, through CMD_Dn in the order stated. The transistors TR1, TR2, through TRn and the resistor R may be included in the calculating unit 315. That is, the transistors TR1, TR2, through TRn that are respectively embodied in the first through n memory chips 340_1, 3402, through 340_n in FIG. 3A may be also embodied in the transmission memory chip 315 in FIG. 3B. The remaining elements of FIG. 3B are the same as corresponding elements of FIG. 3A except for the above description, and thus the detailed description of the remaining elements of FIG. 3B will not be repeated.

Figure 4A:
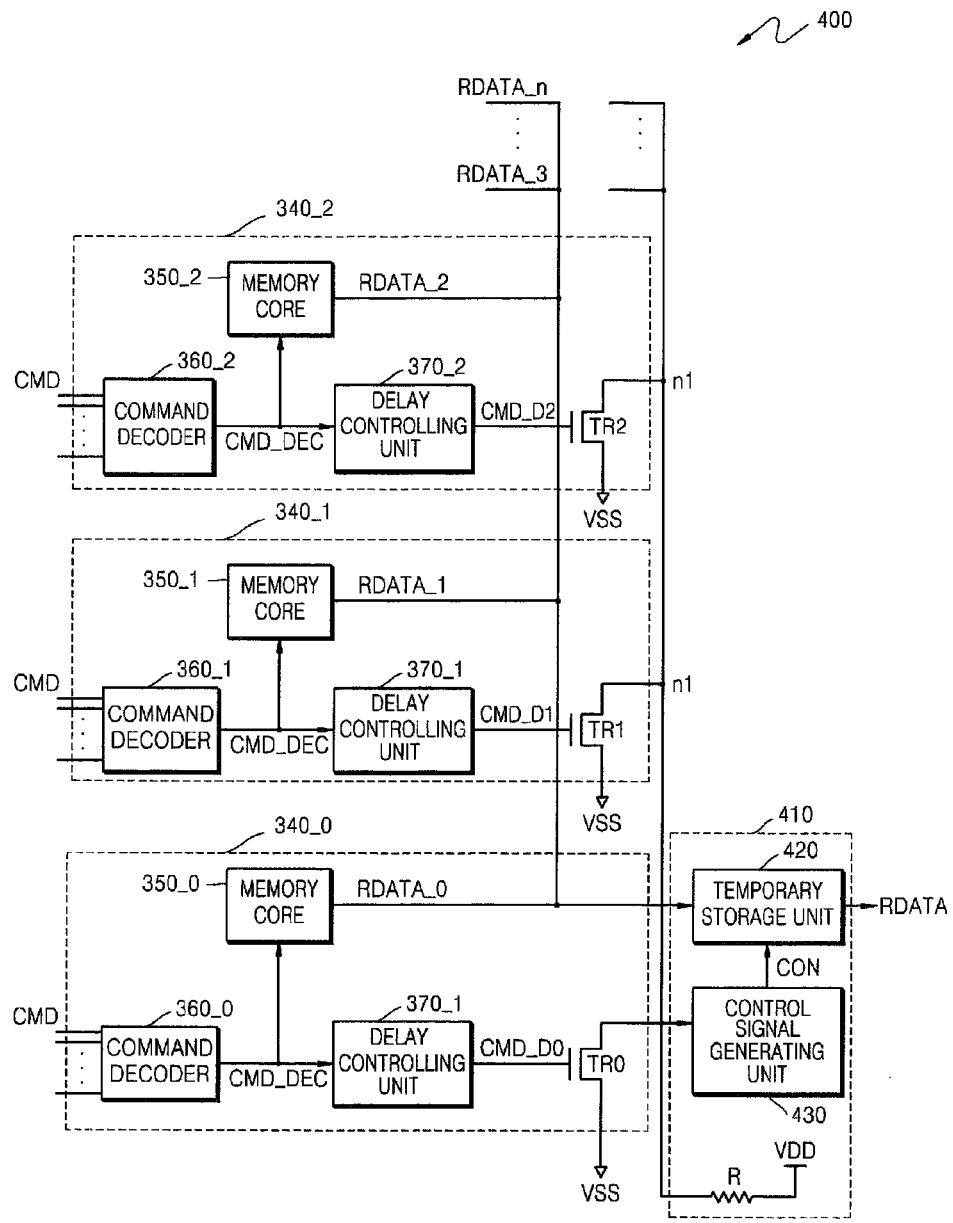
FIG. 4A is a block diagram of a multi-chip package memory device according to another embodiment.

FIG. 4A is a block diagram of a multi-chip package memory device 400 according to another embodiment.

Referring to FIGS. 3A and 4A, the multi-chip package memory device 400 may include a transmission memory chip 410, and first through n memory chips 340_1, 340_2, through 340_n that are stacked on the transmission memory chip 410, like the multi-chip package memory device 300 of FIG. 3. However, the transmission memory chip 410 includes a memory core 350_0, unlike the transmission memory chip 310 of FIG. 3. That is, the transmission memory chip 410 may function as both a memory chip and an interface chip. The transmission memory chip 410 may include the memory core 350_0, a command decoder 360_0 and a delay controlling unit 370_0 in order to function as the memory chip, and may include a control signal generating unit 430 and a temporary storage unit 420 in order to function as the interface chip. In addition, the transmission memory chip 410 may further include a transistor TR0 performing the same function as that of the transistor TR1 or TR2. The memory core 350_0, the command decoder 360_0 and the delay controlling unit 370_0 perform the same functions as those of the memory core 350_1, the command decoder 360_1 and the delay controlling unit 370_1 of FIG. 3, respectively, and thus details thereof are not repeated. The operations of the control signal generating unit 430 and the temporary storage unit 420 are the same as those of the control signal generating unit 330 and the temporary storage 320 of FIG. 3, respectively, except that each of the control signal generating unit 430 and the temporary storage unit 420 receive n+1 read data, that is, read data RDATA_0 in addition to the first through n read data RDATA_1, RDATA_2, through RDATA_n, and n+1 delay commands, that is, a delay command CMD_D0 in addition to the delay commands CMD_D1, CMD_D2, through CMD_Dn, and thus details thereof are not repeated. That is, the transmission memory chip 410 that corresponds to the transmission memory chip 310 of FIG. 3 may also perform the same function as that of each of the first through n memory chips 340_1, 340_2, through 340_n.

Figure 4B:
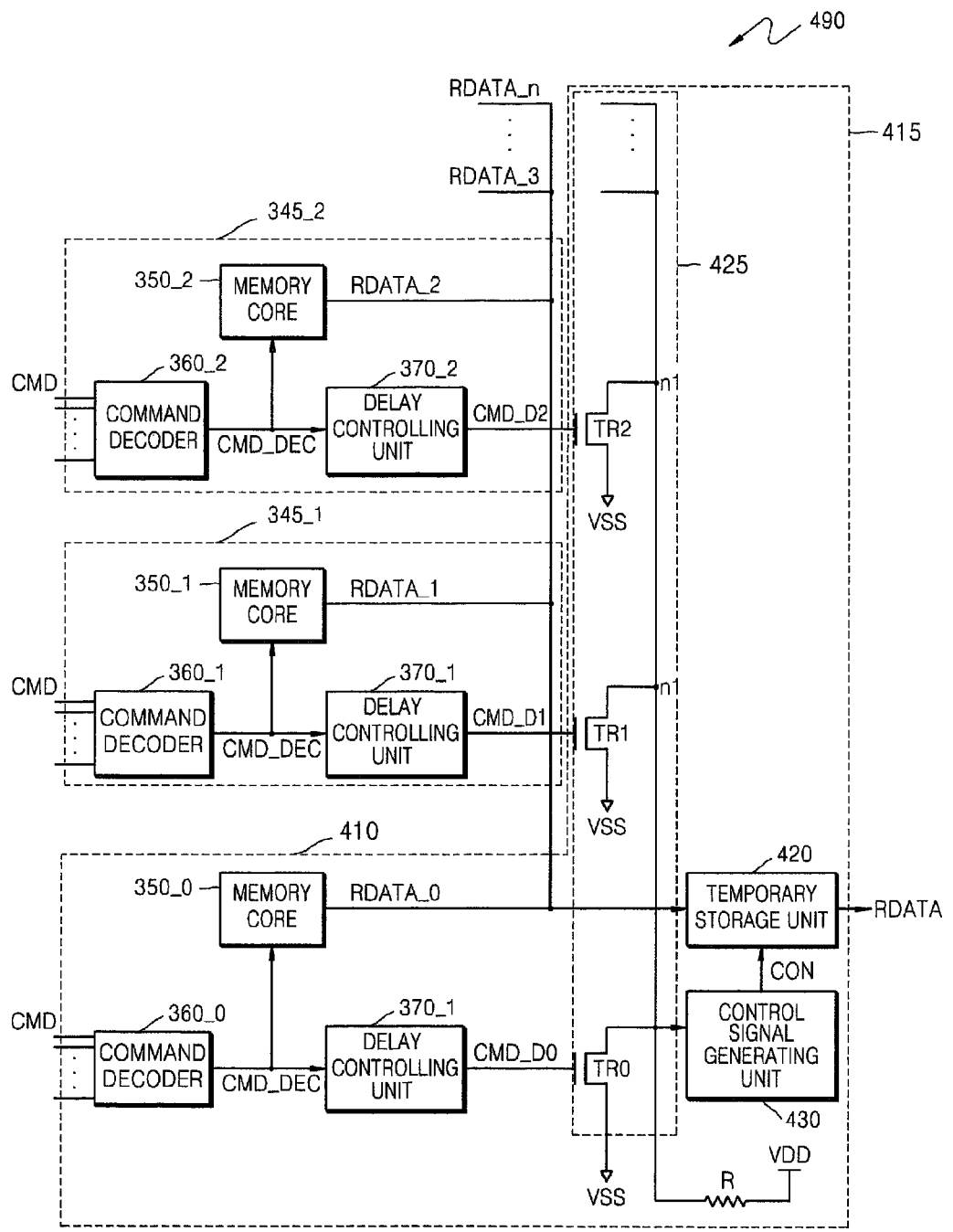
FIG. 4B is a block diagram of a multi-chip package memory device according to another embodiment.
Figure 5A:
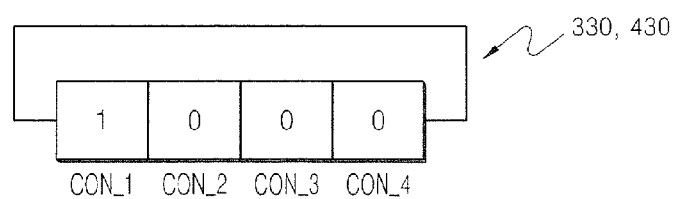
FIGS. 5A through 5D are diagrams of control signal generating units of FIGS. 3 and 4, according to embodiments.
Figure 5B:
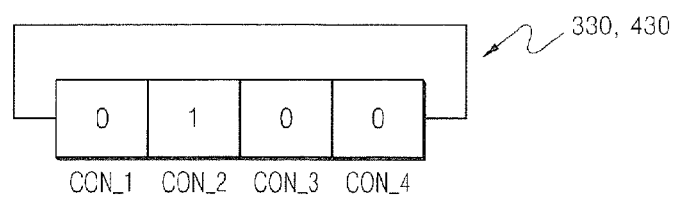
Figure 5C:
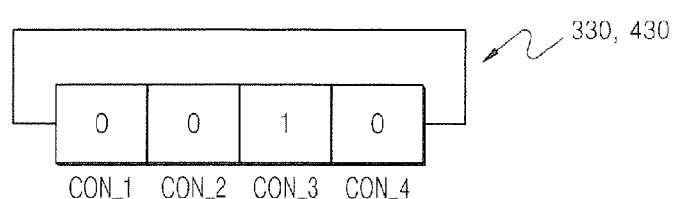
Figure 5D:
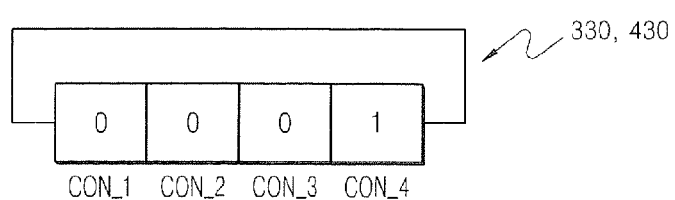

FIG. 4B is a block diagram of a multi-chip package memory device 400 according to another embodiment.

Referring to FIGS. 3B and 4B, the multi-chip package memory device 490 may include a transmission memory chip 410, and first through n memory chips 345_1, 345_2, through 345_n that are stacked on the transmission memory chip 415, like the multi-chip package memory device 390 of FIG. 3B. However, the transmission memory chip 415 includes a memory core 350_0, unlike the transmission memory chip 315 of FIG. 3B. That is, the transmission memory chip 415 may function as both a memory chip and an interface chip. The remaining elements of FIG. 4B are the same as corresponding elements of FIGS. 3B and 4A except for the above description, and thus the detailed description of the remaining elements of FIGS. 3B and 4A will not be repeated.

FIGS. 5A through 5D are diagrams of the control signal generating units 330 or 430 of FIGS. 3 and 4, according to embodiments.

Figure 6:
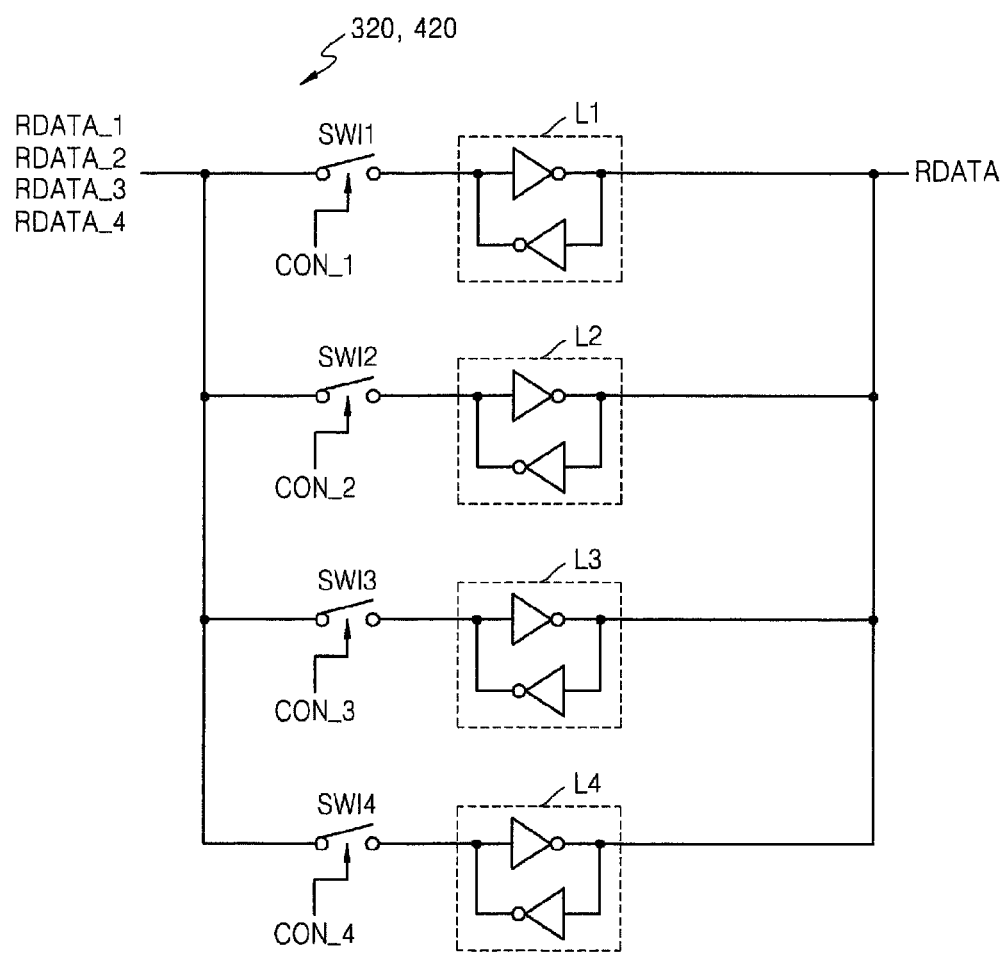
FIG. 6 is a circuit diagram of temporary storage units of FIGS. 3 and 4, according to embodiments.

FIG. 6 is a circuit diagram of the temporary storage units 320 or 420 of FIGS. 3 and 4, according to embodiments.

With reference to FIGS. 3 through 6, operations of the control signal generating units 330 or 430 and operations of the temporary storage units 320 or 420 will be described. For convenience of description, the case where the multi-chip package memory device 300 of FIG. 3 performs a read operation will be described. In addition, it is assumed that first through fourth memory chips 340_1 through 340_4 are used and read commands are sequentially applied to the first through fourth memory chips 340_1 through 340_4. For convenience of description, the read command applied to the first memory chip 340_1 is referred to as a first read command, the read command applied to the second memory chip 340_2 is referred to as a second read command, the read command applied to the third memory chip (not shown) is referred to as a third read command, and the read command applied to the fourth memory chip (not shown) is referred to as a fourth read command.

When the first read command is applied to the first memory chip 340_1, the command decoder 360_1 decodes the first read command, and then outputs a first decoding command. The memory core 350_1 outputs the first read data RDATA_1 in response to the first decoding command. The delay controlling unit 370_1 delays the first decoding command by as much as a time taken for the memory core 350_1 to perform a read operation, and outputs a first delay command CMD_D1.

Then, when the second read command is applied to the second memory chip 340_2, a command decoder 360_2 decodes the second read command, and then outputs a second decoding command. A memory core 350_2 outputs second read data RDATA_2 in response to the second decoding command. The delay controlling unit 370_2 delays the second decoding command by as much as a time taken for the memory core 350_2 to perform a read operation, and then outputs a second delay command CMD_D2.

Then, when third and fourth read commands are sequentially applied to the second and fourth memory chips, third and fourth read data, and third and fourth delay commands are sequentially output by using the same method as the above described method.

When the first and second delay commands CMD_D1 and CMD_D2 and the third through fourth delay commands are sequentially output, their corresponding transistors are sequentially turned-on. For example, when the delay controlling unit 370_1 outputs the first delay command CMD_D1, the transistor TR1 is instantly turned-on and then turned-off. Thus, the control signal generating unit 330 stores values illustrated in FIG. 5A, and a control signal CON has a value '1000'. In response to the control signal CON having the value '1000', a first switch SWI1 of the temporary storage unit 320 is switched-on, and second through fourth switches SWI2, SWI3 and SWI4 of the temporary storage unit 320 are switched-off. Then, the first read data RDATA_1 is stored in a first latch L1.

After a predetermined time elapses, when the delay controlling unit 370_2 outputs the second delay command CMD_D2, the transistor TR2 is instantly turned-on and then turned-off. Thus, the control signal generating unit 330 also stores values illustrated in FIG. 5B, and a control signal CON has a value '0100'. In response to the control signal CON having the value '0100', the second switch SWI2 of the temporary storage unit 320 is switched-on, and the first switch SWI1, the third switch SWI3, and the fourth switch SWI4 of the temporary storage unit 320 are switched-off. Then, an operation of storing the first read data RDATA_1 in the first latch L1 is finished, and then the second read data RDATA_2 is stored in a second latch L2.

When the third delay command and the third read data are output by using the same method as the above described method, the third read data is stored in a third latch L3. When the fourth delay command and the fourth read data are output by using the same method as the above described method, the fourth read data is stored in a fourth latch L4

So far, for convenience of description, the case where the multi-chip package memory device 300 of FIG. 3 performs a read operation is described. However, even when the multi-chip package memory device 400 of FIG. 4 operates, the temporary storage unit 420 and the control signal generating unit 430 may operate in the same method of that of the multi-chip package memory device 300 of FIG. 3.

Figure 7:
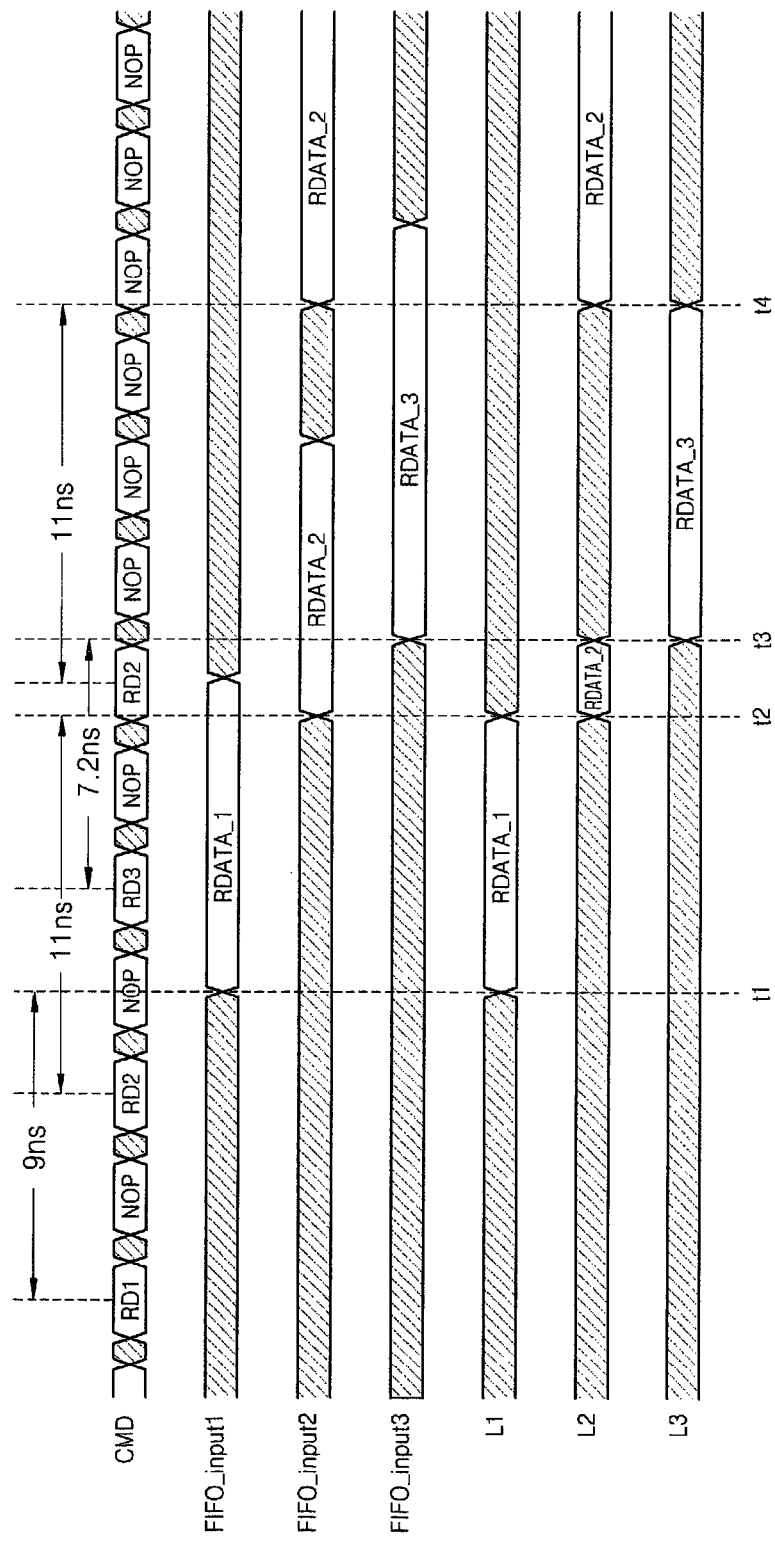
FIG. 7 is a timing diagram of a signal and data, according to an embodiment.

FIG. 7 is a timing diagram of a signal and data, according to an embodiment.

With reference to FIGS. 3 through 7, an operation according to an embodiment will be described. Hereinafter, for convenience of description, the case where the multi-chip package memory device 300 of FIG. 3 performs a read operation is illustrated. Alternatively, the case where the multi-chip package memory device 400 of FIG. 4 may perform a read operation also applies.

With regard to a received read command CMD, a first read command RD1, a second read command RD2, a third read command RD3, and the second read command RD2 are sequentially applied in the order stated. Hereinafter, it is assumed that a $k^{th}$ read command (k is a natural number) is a signal applied to a $k^{th}$ memory core. In addition, it is assumed that a process variation during the read operation of the first memory chip 340_1 is 9 [ns], a process variation during the read operation of the second memory chip 340_2 is 11 [ns], and a process variation during the read operation of the third memory chip is 7.2 [ns].

When the first read command RD1 is applied, the first read data RDATA_1 is applied to the temporary storage unit 320 from a point of time t1. Then, when the second read command RD2 is applied, the second read data RDATA_2 is applied to the temporary storage unit 320 from a point of time t2. When the third read command RD3 is applied, the third read data RDATA_3 is applied to the temporary storage unit 320 from a point of time t3. Lastly, when the second read command RD2 is applied again, the second read data RDATA_2 is applied to the temporary storage unit 320 from a point of time t4.

Each delay controlling unit delays and outputs a command signal in consideration of a corresponding process variation. Hereinafter, it is assumed that the first through third read commands RD1, RD2, and RD3 are applied to their corresponding delay controlling units, respectively, rather than being decoded. That is, the delay controlling unit 370_1 of the first memory chip 340_1 delays the first read command RD1 by as much as 9 [ns], and then applies the first read command RD1 to the control signal generating unit 330 at a point of time t1. Since the control signal generating unit 330 outputs a control signal CON having a value '1000' at a point of time t1, the temporary storage unit 320 stores the first read data RDATA_1 in the first latch L1. Then, the delay controlling unit 370_2 of the second memory chip 340_2 delays the second read command RD2 by as much as 11 [ns], and applies the second read command RD2 to the control signal generating unit 330 at the point of time t2. Since the control signal generating unit 330 outputs a control signal CON having a value '0100' at the point of time t2, the temporary storage unit 320 stops storing the first read data RDATA_1, and stores the second read data RDATA_2 in the second latch L2. Then, a delay controlling unit of the third memory chip delays the third read command RD3 by as much as 7.2 [ns], and then applies the third read command RD3 to the control signal generating unit 330 at a point of time t3. Since the control signal generating unit 330 outputs a control signal having a value '0010' at a point of time t3, the temporary storage unit 320 stops storing the second read data RDATA_1, and then stores the third read data RDATA_3 in the third latch L3. Lastly, the delay controlling unit 370_2 of the second memory chip 340_2 delays the second read command RD2 by as much as 11 [ns], and then applies the second read command RD2 to the control signal generating unit 330 at a point of time t4. Since the control signal generating unit 330 outputs a control signal CON having a value '0001' at the point of time t2, the temporary storage unit 320 stops storing the third read data RDATA_3, and then stores the second read data RDATA_2 in the second latch L2.

Accordingly, each read data may be stored in the temporary storage unit 320 or 420 without being overlapped although process variations of memory chips are different.

While the inventive concept has been particularly shown and described with reference to exemplary embodiments thereof, it will be understood that various changes in form and details may be made therein without departing from the spirit and scope of the following claims.

What is claimed is:

1. A multi-chip package memory device comprising a plurality of stacked memory chips, the multi-chip package memory device comprising:
 a transmission memory chip comprising a temporary storage unit, and transmitting a received command or received data to a corresponding memory chip or an external element; and
 a plurality of memory chips each comprising a memory core, each delaying the received command according to properties of the corresponding memory chip from among the memory chips, and then outputting a delay command, and stacked on the transmission memory chip,
 wherein the transmission memory chip stores the received data in different portions of the temporary storage unit when a plurality of the delay commands are respectively received.

2. The multi-chip package memory device of claim 1, wherein the transmission memory chip further comprises a control signal generating unit generating control signals having bits that are sequentially shifted when the delay commands are respectively received, and
 wherein the temporary storage unit stores the received data in response to the control signal.

3. The multi-chip package memory device of claim 2, wherein each of the memory chips comprises a transistor comprising a gate to which a corresponding delay command is applied, a first terminal connected to a first node, and a second terminal connected to a ground voltage,
 wherein the transmission memory chip comprises a resistor connected between the first node and a power voltage, and
 wherein the control signal generating unit is connected between the first node and the temporary storage unit, and generates the control signals in response to a signal applied through the first node.

4. The multi-chip package memory device of claim 2, wherein the transmission memory chip further comprises a calculating unit performing a logical sum on the delay commands and then sequentially outputting an output signal, and wherein the control signal generating unit generates the control signals in response to the output signal of the calculating unit.

5. The multi-chip package memory device of claim 4, wherein the calculating unit comprises:

a plurality of transistors each comprising a gate to which a corresponding delay command is applied, a first terminal connected to a first node, and a second terminal connected to a ground voltage; and a resistor between the first node and a power voltage.

6. The multi-chip package memory device of claim 2, wherein the control signal generating unit comprises a shift resistor.

7. The multi-chip package memory device of claim 1, wherein each of the memory chips comprises a delay controlling unit delaying the received command by as much as a time taken to access the memory core, and then outputting the delay command.

8. The multi-chip package memory device of claim 1, wherein the plurality of memory chips are vertically stacked on the transmission memory chip, and are connected via a through electrode.

9. The multi-chip package memory device of claim 1, wherein the command comprises a read command, and wherein the temporary storage unit comprises a first-in first-out (FIFO) unit.

10. The multi-chip package memory device of claim 1, wherein the transmission memory chip further comprises a memory core, and delays the received command and outputs a delay command.

* * * * *